(12) United States Patent
Singh et al.

(10) Patent No.: US 6,210,522 B1
(45) Date of Patent: Apr. 3, 2001

(54) ADHESIVE BONDING LAMINATES

(75) Inventors: Jeanne Marie Saldanha Singh, Lexington; Paul Timothy Spivey, Nicholasville, both of KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/333,455

(22) Filed: Jun. 15, 1999

(51) Int. Cl.$^7$ ..................................................... B41J 2/16
(52) U.S. Cl. ..................... 156/313; 437/209; 156/320; 428/901; 428/355 EP
(58) Field of Search ................ 156/306.6, 307.3, 156/309.9, 313, 320, 321, 331.7; 428/901, 209, 343, 355 R, 355 EP, 412; 437/209

(56) References Cited

U.S. PATENT DOCUMENTS

| | | |
|---|---|---|
| 3,900,360 | 8/1975 | Leatherman . |
| 3,903,351 | 9/1975 | Ando et al. . |
| 4,199,645 | 4/1980 | Schwarz . |
| 4,273,827 | 6/1981 | Sweeney et al. . |
| 4,313,996 | 2/1982 | Newman et al. . |
| 4,497,678 | 2/1985 | Nussbaum . |
| 4,666,758 | 5/1987 | Hunter et al. . |
| 4,762,983 | 8/1988 | Oogita et al. . |
| 4,935,086 | 6/1990 | Baker et al. . |
| 5,204,399 | 4/1993 | Edelman . |
| 5,208,188 | 5/1993 | Newman . |
| 5,304,269 | 4/1994 | Jacaruso et al. . |
| 5,439,956 | 8/1995 | Noguchi . |
| 5,441,918 | 8/1995 | Morisaki et al. . |
| 5,519,425 | 5/1996 | Dietl et al. . |
| 5,592,737 | 1/1997 | Middelman et al. . |
| 5,643,390 | 7/1997 | Don et al. . |
| 5,652,608 | 7/1997 | Watanabe et al. . |
| 5,696,032 | 12/1997 | Phelps, Jr. et al. . |
| 5,696,546 | 12/1997 | Narang et al. . |
| 5,759,873 | 6/1998 | Kata et al. . |
| 5,766,740 | 6/1998 | Olson . |
| 5,863,815 | 1/1999 | Egawa . |

FOREIGN PATENT DOCUMENTS

| | | |
|---|---|---|
| 742120 | 11/1996 | (EP) . |
| 867293 | 9/1998 | (EP) . |
| WO 9855316 | 12/1998 | (WO) . |

Primary Examiner—Daniel Zirker
(74) Attorney, Agent, or Firm—John A. Brady

(57) ABSTRACT

An adhesive bonding laminate includes a first thermoplastic adhesive film that is capable of adhesively bonding to an epoxy coating and a second thermoset adhesive film that is capable of adhesively bonding to a passivated surface of a substrate. The first thermoplastic adhesive film is adhesively bonded to the second thermoset adhesive film. Ink jet printheads, ink jet print cartridges and methods of attaching a flexible circuit to substrate employ the adhesive bonding laminate.

21 Claims, 3 Drawing Sheets

ADHESIVE BONDING LAMINATES

FIELD OF THE INVENTION

The present invention relates to adhesive bonding laminates, and more particularly, to adhesive bonding laminates which may be used to attach a flexible circuit to a substrate. The invention is also directed to methods of attaching a flexible circuit to a passivated surface of a substrate, and to ink jet printhead assemblies and ink jet print cartridges including such adhesive bonding laminates.

BACKGROUND OF THE INVENTION

Thermal ink jet print cartridges operate by rapidly heating a small volume of ink to generate a bubble caused by rapid vaporization of an ink vehicle for driving ink through one or more of a plurality of orifices so as to deposit one or more drops of ink on a recording medium, such as a sheet of paper. Typically, the orifices are arranged in one or more linear arrays in a nozzle member. The properly sequenced ejection of ink from each orifice causes characters or other images to be printed upon the paper as the printhead is moved relative to the paper. The paper is typically shifted each time fast and quiet, as only the ink droplet is in contact with the paper. Such printers produce high quality printing and can be made both compact and economical.

A typical ink jet cartridge assembly includes a cartridge body which is attached to a printhead assembly (sometimes referred to hereinafter as "printhead"). Ink which is disposed within the cartridge body flows to the printhead and is expelled in a known manner. More particularly, the cartridge body includes a die cavity in which the printhead is disposed. The printhead is in the form of a nozzle plate attached to a semiconductor chip. A plurality of heater elements are carried by the semiconductor chip, with each heater element being disposed adjacent to a respective nozzle in the nozzle plate. An electrical circuit, which may be in the form of a TAB (Tape Automated Bonding) circuit, electrically interconnects the heater elements with appropriate circuitry in the ink jet printer such that the cartridge elements may be selectively energized as the carriage of the printer travels across the print medium.

The printhead is typically disposed within the die cavity of the cartridge body on a substrate. The silicon chip and nozzle layer are attached to the substrate using a known die attach adhesive. The TAB circuit typically surrounds the printhead and is fastened to the circuit platform of the cartridge using a pressure sensitive adhesive. The TAB circuit includes a plurality of copper leads which extend therefrom and connect with the heater elements on the printhead.

The flexible circuit is typically comprised of a polyimide layer on which copper conductive traces are formed. Preferably, a thin layer of gold is formed on top of the copper conductive traces and provides an amount of protection from inks which can cause corrosion of the circuits. However, for circuits used at higher voltages and higher operating speeds, an epoxy coating or the like is often screened on top of these gold/copper traces to give further protection from inks. The circuit is typically adhered to the printhead and cartridge body by means of a pressure sensitive adhesive, for example an adhesive having an acrylic base.

During routine maintenance of the printhead in the printing process, the nozzle holes are wiped by a wiping mechanism. As a result, ink can travel to the underside of the circuit owing to capillary action of the acrylic-based pressure sensitive adhesive. The pressure sensitive adhesive allows the ink to wick under and be trapped between the circuit and the substrate, causing corrosion or electrical shorting of the flexible circuit in areas with no protective coating. Accordingly, there is a need for improved adhesives which exhibit a reduced ink wicking tendency.

Furthermore, in many applications, precise alignment between the circuit and the print chip are necessary. In these cases, the circuit is in very close proximity or even in soft contact with the substrate during the alignment. The typical pressure sensitive adhesive does not allow the circuit to slip for fine alignment adjustments once it is in contact with the adhesive. One alternative to increase manufacturing efficiency is to provide a release liner on the pressure sensitive adhesive until after alignment and electrical interconnection of the flexible circuit and semiconductor chip. This however is not a reliable process, as removing the release layer potentially can stress the interconnect bonds between the flexible circuit and print chip where the release layer must be removed very close to any TAB bonds.

Another alternative is to insert the adhesive between the circuit and substrate after electrically interconnecting the circuit and the printchip. However, the thin (about 0.001 inch) pressure sensitive adhesive bonding films are often too soft and compliant to be inserted between two surfaces in soft contact.

It would be advantageous to provide a film adhesive which provides good bonding, for example adhering to both a flexible circuit having an epoxy coating and a passivated surface of a substrate, while resisting ink wicking and allowing precise alignment of parts to be bonded. Therefore, there remains a need for an adhesive to attach a flexible circuit to a substrate, for example in an ink jet printhead assembly, which overcomes disadvantages of the prior art.

SUMMARY OF THE INVENTION

Accordingly, it is an object of the present invention to provide novel adhesive bonding laminates which overcome one or more disadvantages of the prior art. It is a more specific object of the invention to provide a dual layer adhesive bonding laminate which, when employed in an ink jet printhead assembly to bond a flexible circuit to a substrate, reduces or eliminates ink from wicking between the circuit and substrate and therefore prevents the ink from causing corrosion or electrical shorting of the flexible circuit.

These and additional objects and advantages are provided by an adhesive bonding laminate, ink jet printheads and ink jet print cartridges containing the same, and methods of attaching a flexible circuit to a substrate using the adhesive bonding laminate.

The adhesive bonding laminate of the present invention comprises a first thermoplastic adhesive film that is capable of adhesively bonding to an epoxy coating and a second thermoset adhesive film that is capable of adhesively bonding to a passivated surface of a substrate. Furthermore, the first thermoplastic adhesive film is adhesively bonded to the second thermoset adhesive film. In one embodiment of the invention, the first thermoplastic adhesive film comprises polycarbonate or thermoplastic polyether urethane, and the second thermoset adhesive film comprises phenolic polymer. Adhesive bond as used herein refers to a non-releasable, non-repositionable adhesive bond, unlike the releasable, repositionable adhesive bonds similar to those used as the adhesives in self-stick removable note pads, and the like.

The ink jet printhead of the present invention comprises a substrate having a passivated surface. A silicon chip is arranged on the passivated surface of the substrate. A flexible circuit having an epoxy coating on one side thereof is attached to the passivated surface of the substrate using an adhesive bonding laminate of the present invention. The adhesive bonding laminate is located between the epoxy coated side of the flexible circuit and the passivated surface of the substrate.

The ink jet print cartridge of the present invention comprises an ink jet ink housing and an ink jet printhead, wherein the ink jet printhead comprises a substrate having a passivated surface, the substrate being attached to the ink jet print housing, a silicon chip located on the passivated surface of the substrate, a flexible circuit, and an adhesive bonding laminate of the present invention. The flexible circuit has an epoxy coating on one side thereof. The adhesive bonding laminate is located between the epoxy coated side of the flexible circuit and the passivated surface of the substrate.

The present invention also comprises a method for attaching a flexible circuit to a substrate utilizing the adhesive bonding laminate of the present invention. A flexible circuit is electrically bonded to a silicon chip. Electrically bonding comprises making an electrical connection between the flexible circuit and the silicon chip. The second side of the adhesive bonding laminate is adhesively bonded to the passivated surface of the substrate. The silicon chip is then adhesively bonded to the passivated surface of the substrate, and the flexible circuit is adhesively bonded to the substrate using the adhesive bonding laminate. In one embodiment, the silicon chip is adhesively bonded to the substrate using a tack and hold adhesive and a die-attach adhesive.

Still other objects, advantages and novel features of the present invention will become apparent to those skilled in the art from the following detailed description, which is simply by way of illustration various modes contemplated for carrying out the invention. As will be realized, the invention is capable of other different obvious aspects all without departing from the invention. Accordingly, the drawings and the description are illustrative in nature and not restrictive.

BRIEF DESCRIPTION OF THE DRAWING

While the specification concludes with claims particularly pointing out and distinctly claiming the present invention, it is believed the same will be better understood from the following description taken in conjunction with the accompanying drawings in which:

DETAILED DESCRIPTION

Reference will now be made in detail to various embodiments of the invention, an example of which is illustrated in the accompanying drawings, wherein the numerals indicate the same element throughout the views.

The invention will be described in a context of a tri-color ink jet cartridge but it will be evident from the following description that the principles of the invention are equally applicable to monochrome cartridges.

Figure 1:
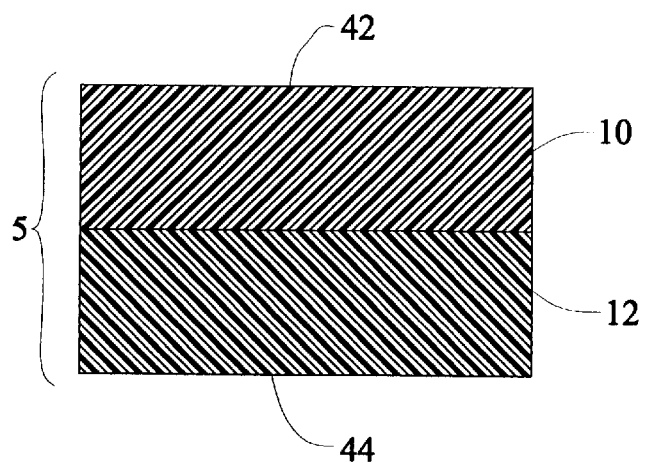
FIG. 1 is a cross-sectional view of one embodiment of an adhesive bonding laminate of the present invention.
Figure 2:
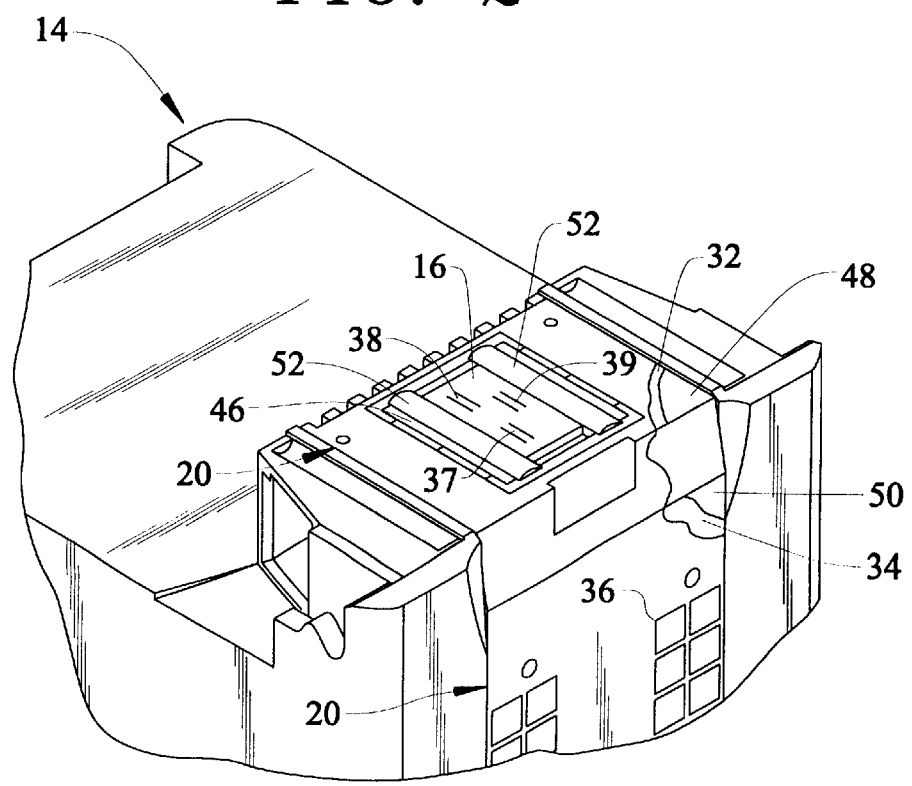
FIG. 2 is a perspective view of the bottom portion of an ink jet print cartridge and printhead.
Figure 3:
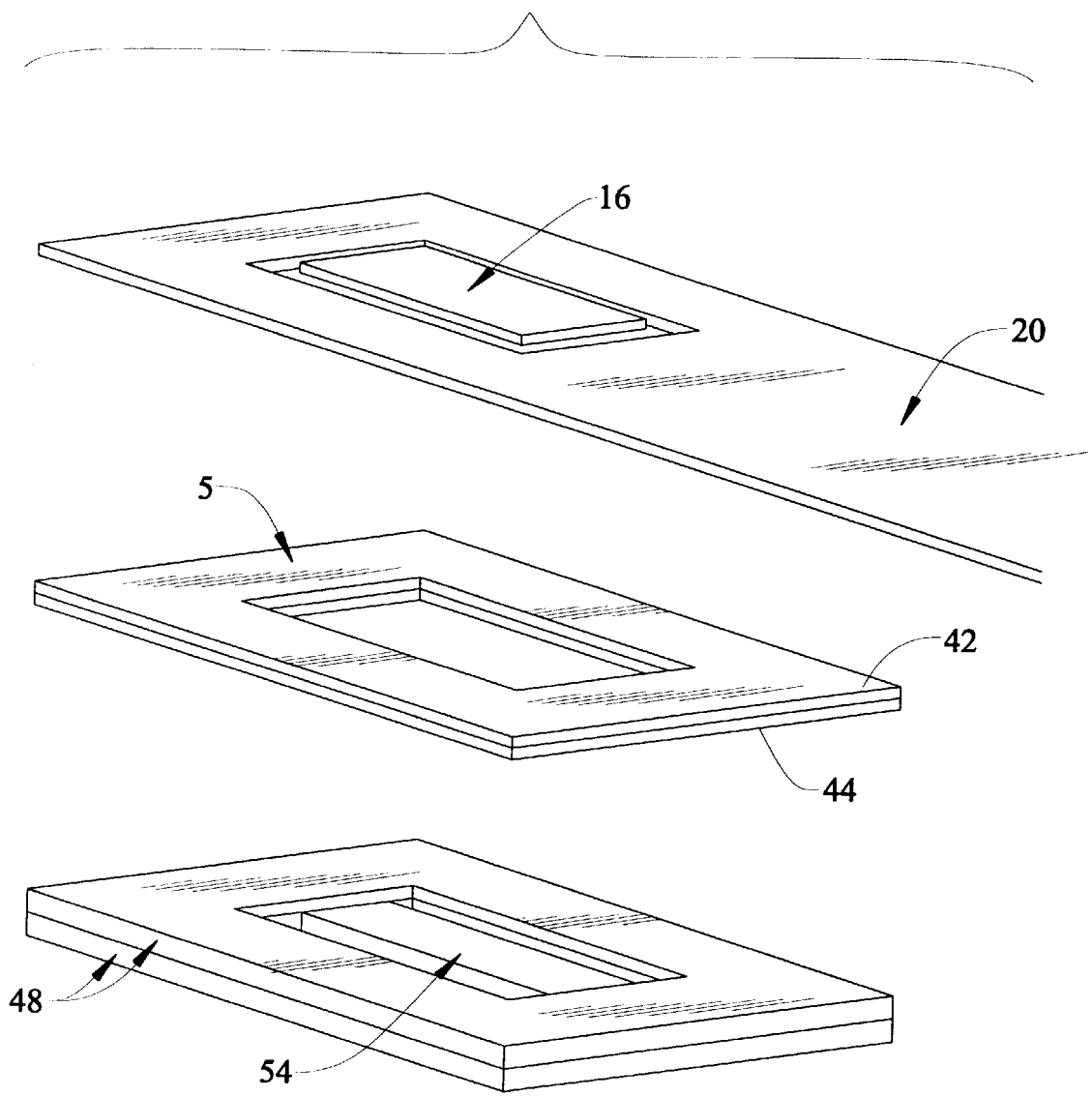
FIG. 3 is an exploded view of a printhead assembly.
Figure 4:
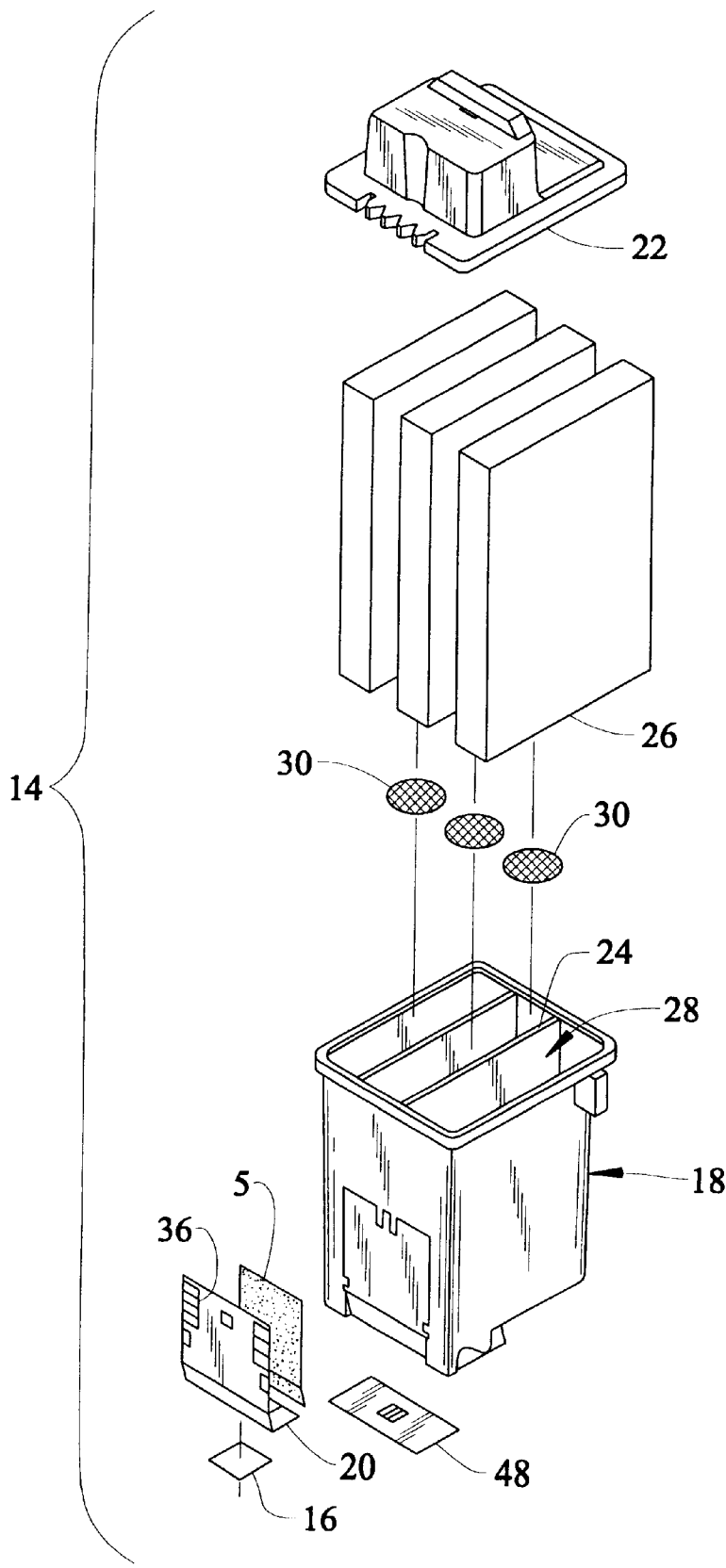
FIG. 4 is a perspective view of the bottom portion of an ink jet print cartridge.

As shown in FIG. 1, the present invention comprises a dual layer adhesive bonding laminate 5, comprising a first thermoplastic adhesive film 10, and a second thermoset adhesive film 12, wherein the first thermoplastic adhesive film 10 is adhesively bonded to the second thermoset adhesive film 12. Furthermore, the first thermoplastic adhesive film 10 is capable of adhesively bonding to an epoxy coated side of a flexible circuit, for example a TAB circuit 20 as shown in FIGS. 2, 3 and 4. The second thermoset adhesive film 12 is capable of adhesively bonding to a passivated surface of a substrate, for example substrate 48 as shown in FIGS. 2, 3 and 4. The phrase "adhesively bond" refers to a permanent, compatible adhesive bond. In an exemplary embodiment, the substrate comprises a metal substrate. In another exemplary embodiment, the substrate comprises aluminum, zinc, stainless steel, or an alloy thereof.

In a preferred embodiment of the adhesive bonding laminate 5, the first thermoplastic adhesive film 10 comprises polycarbonate or thermoplastic polyether urethane. The second thermoset adhesive film 12 comprises phenolic polymer. These films may be formed completely of the indicated polymers or contain the polymers in combination with other polymers and/or conventional adhesive components. Preferably, the adhesive bonding laminate 5 comprises polycarbonate for the first thermoplastic adhesive film 10 and phenolic polymer for the second thermoset adhesive film 12. In another embodiment of the present invention, the first thermoplastic adhesive film 10 comprises polyether urethane and the second thermoset adhesive film 12 comprises phenolic polymer.

Adhesive films for use in the present invention are available from a variety of sources. For example, phenolic polymer for use in the present invention may be obtained commercially from 3M Corp. under the designation Scotch Weld 583. Polycarbonate for use in the adhesive bonding laminate may be obtained commercially from Alpha Metals under the designation Staystik 401. Polyether urethane for use in the present invention may be obtained commercially from Deerfield Inc. under the designation 6200S.

The thickness of the films for use in the laminates of the invention may vary depending on the desired use of the laminates. Suitably, each film may have a thickness ranging from about 0.0001 to about 0.008 inch, with a film thickness of about 0.001 to about 0.004 inch and a laminate thickness of about 0.002 to about 0.006 inch being preferred for use in ink jet printhead assemblies as discussed herein.

In one embodiment of the present invention, the adhesive bonding laminate 5 comprises a first thermoplastic adhesive film 10 in direct contact with and bonded to the second thermoset adhesive film 12. In a more preferred embodiment of the adhesive bonding laminate 5, the first thermoplastic adhesive film 10 is in direct contact with and bonded to the second thermoset adhesive film 12 along the entirety of their adjacent surfaces, wherein the entire surface of the first thermoplastic adhesive film 10 is continuously adhesively bonded to the entire adjacent surface of the second thermoset adhesive film 12.

In another embodiment of the present invention, the adhesive bonding laminate 5 comprises a first thermoplastic adhesive film 10 in direct contact with and bonded to the second thermoset adhesive film 12. Interposed between the first thermoplastic adhesive film 10 and the second thermoset adhesive film 12 is a means for providing rigidity to the adhesive bonding laminate. The means may comprise a glass woven mat or an open fabric having high strength properties. The fabric may typically be formed of strands of glass fibers or the like.

In yet another embodiment of the present invention, the adhesive bonding laminate 5 comprises a first thermoplastic adhesive film 10 in direct contact with and bonded to the second thermoset adhesive film 12. The first thermoplastic adhesive film 10 and/or the second thermoset adhesive film 12 may comprise supported adhesive films. Supported adhesives comprise a means for providing rigidity to the adhesive film. The means may comprise a composite comprising an open fabric having high strength properties within the adhesive film. The adhesive is coated or formed typically on a glass fabric carrier. The fabric may typically be formed of strands of glass fibers or the like.

As shown in FIG. 2, one embodiment of the ink jet printhead of the present invention comprises a substrate 48 having a passivated surface mounted on a print cartridge 14, a silicon chip 16 mounted on the passivated surface of the substrate 48 and a TAB circuit 20 attached to the passivated surface of the substrate 48 and print cartridge 14. The TAB circuit for use in the present invention may be obtained commercially, for example from 3M. The epoxy coating on the TAB circuit for use in the present invention may be obtained commercially, for example from Asahi Glass Co. under the designation CCR-232GF No. 6 Epoxy. The TAB circuit 20 is attached to the passivated surface of the substrate 48 by an adhesive bonding laminate 5 according to the invention. The adhesive bonding laminate 5 bonds the epoxy coated side of the flexible circuit 20 and to the passivated surface of the substrate 48 and is not visible in FIG. 2.

The substrate 48 is preferably passivated with a polymer coating to protect the substrate from corrosion and possible shorting of the flexible circuit by the ink and to prevent metal ions from entering the ink composition. Preferably, the polymer coating is a poly-para-xylylene having the structure

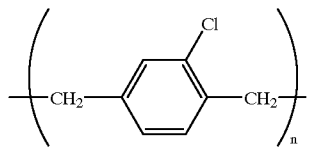

The poly-para-xylylene preferably used in the present invention may be obtained commercially from Union Carbide Corp. under the designation Parylene C. The polymer coating is from about 5 microns to about 3 mils in thickness. Preferably, the polymer coating is vapor vacuum deposited to produce a uniform and even coating on the substrate 48.

Accordingly, FIG. 3 depicts an exploded view of the ink jet printhead assembly including the adhesive bonding laminate 5. The adhesive bonding laminate 5 is located between the substrate 48 having a passivated surface and the flexible circuit 20. The first side 42 of the adhesive bonding laminate 5 is adjacent the flexible circuit 20 and the second side 44 of the adhesive bonding laminate 5 is adjacent the passivated surface of the substrate 48. The adhesive bonding laminate 5 is suitably die cut or otherwise formed before assembly to allow the silicon chip 16 to be arranged adjacent to the passivated surface of the substrate 48 in a chip pocket 54.

The adhesive bonding laminate 5 may be prepared by utilizing solvent lamination. For example, the adhesive bonding laminate 5 may be prepared by applying a solvent, preferably either acetone or methyl ethyl ketone, to one side of the thermoplastic adhesive film 10. Before the solvent completely evaporates, the thermoset adhesive film 12 is placed on the solvent applied side of the thermoplastic adhesive film 10. The two layers (i.e., the thermoplastic adhesive film 10 and the thermoset adhesive film 12) are then placed under pressure to form the adhesive bonding laminate 5. Preferably, the pressure is applied by a roller or press. The adhesive bonding laminate 5 is then die cut to the appropriate shape and configuration to allow the adhesive bonding laminate 5 to fit over the chip pocket 54.

Alternatively, the adhesive bonding laminate 5 may be prepared by utilizing heat lamination. The adhesive bonding laminate 5 may be prepared by placing the two films, i.e., the thermoplastic adhesive film 10 and the thermoset adhesive film 12, one on top of the other and between two release layers 27, formed of a release polytetrafluoroethylene (PTFE) such as Teflon® commercially available from Dupont. The assembled layers are then placed in a hot press 25 at a temperature and pressure, and for a time sufficient to achieve bonding of the adhesive layers 10 and 12 to one another. Suitable bonding conditions include, but are by no means limited to, a temperature of about 200° C. under about 30 psi for about one minute. The adhesive bonding laminate 5 is then die cut to the appropriate shape and configuration to allow the adhesive bonding laminate 5 to fit over the chip pocket 54.

Another embodiment of the present invention is directed to a method for attaching a flexible circuit 20 already connected to a silicon chip 16 to a substrate 48 having a passivated surface. The method comprises providing a silicon chip 16 which is TAB bonded to a flexible circuit 20 and providing the adhesive bonding laminate 5 comprising a first side 42 having the thermoplastic adhesive film 10, and the second side 44 having the thermoset adhesive film 12. The second side 44 of the adhesive bonding laminate 5 is bonded to the passivated surface of the substrate 48, for example by applying a temperature of about 100° C. to about 180° C. under pressure for about 5 to about 30 seconds, more preferably from about 130° C. to about 150° C. for about 10 to about 15 seconds.

A tack and hold adhesive and die-attach adhesive are applied to the silicon chip in order to bond the chip to the substrate surface. The tack and hold adhesive, for example, may comprise an ultraviolet cure or thermal quick cure adhesive. The tack and hold adhesive bonds the chip to the substrate until the die attach adhesive can be cured. The die attach adhesive may be any conventional die attach adhesive known in the art, such as epoxy based adhesives. For example, the silicon chip and flexible circuit assembly may be aligned and tacked to the passivated surface of the substrate using the tack and hold adhesive. Once the chip is properly aligned, the die attach adhesive is then cured, for example at a temperature of from about 110° C. to about 200° C. for about 15 to about 200 minutes, more preferably from about 150° C. to about 175° C. for about 30 to about 180 minutes. During the curing of the die attach adhesive, the thermosetting layer of the adhesive bonding laminate is cured.

As is conventional, the flexible circuit 20 has an epoxy coating on one side thereof. The first side 42 of the adhesive bonding laminate 5 is then bonded to the epoxy coated side of the flexible circuit 20, for example using a temperature of about 200° C. to about 300° C. under pressure for about 5 to about 30 seconds, more preferably from about 225° C. to about 275° C. for about 10 to about 15 seconds. In a more specific embodiment, the first side 42 of the adhesive bonding laminate 5 comprises polyether urethane and the second side 44 of the adhesive bonding laminate 5 comprises a phenolic based adhesive polymer. The first side 42 of the adhesive bonding laminate 5 is bonded to the epoxy coated side of the flexible circuit 20, for example using a temperature of from about 150° C. to about 225° C. under pressure for about 5 to about 30 seconds, more preferably from about 180° C. to about 200° C. for about 10 to about 15 seconds.

As shown in FIG. 4, another embodiment of the present invention is directed to an ink jet print cartridge 14. The ink jet print cartridge shown is a tri-color ink jet printer cartridge. One skilled in the art will appreciate that the principles of the present invention are equally applicable to monochrome cartridges. The ink jet print cartridge 14 comprises an ink jet ink housing 18, a lid 22, an ink jet printhead assembly which comprises a substrate 48 having a passivated surface, a silicon chip 16 on the passivated surface of the substrate 48, and a flexible circuit 20 overlaid and attached to the passivated surface of the substrate 48 by an adhesive bonding laminate 5. The flexible circuit 20 is electrically connected to the silicon chip 16. In another embodiment, the ink jet print cartridge 14 further comprises three ink reservoir chambers 28 divided by two dividing walls 24, in a conventional manner. Three blocks of foam material 26 are inserted into chambers 28, wherein each block 26 is saturated with ink of a different color. The chambers 28 are provided with standpipes on their bottom surfaces through which ink may flow, the ink jet housing 18 having ink flow passages connecting the standpipes to three exit ports in the bottom surface of the housing. Three filters 30 cover the tops of the standpipes to filter the inks as they are drawn out of the chambers.

The foregoing description of the various embodiments of the invention has been presented for the purposes of illustration and description. It is not intended to be exhaustive or to limit the invention to the precise form disclosed. Many alternatives, modifications, and variations will be apparent to those skilled in the art of the above teaching. Particularly, the claimed laminate is suitable for use not only in the ink jet printhead as disclosed but in other adhesive bonding applications as well. Accordingly, this invention is intended to embrace all alternatives, modifications, and variations that have been discussed herein, and others that fall within the spirit and broad scope of the claims.

What is claimed is:

1. A method for attaching a flexible circuit to a substrate, comprising the steps of:

providing a silicon chip electrically bonded to a flexible circuit, wherein the flexible circuit has an epoxy coating on one side thereof;

providing a substrate with a passivated surface;

providing the adhesive bonding laminate comprising a first thermoplastic adhesive film that is capable of bonding to an epoxy coating; and a second thermoset adhesive film that is capable of bonding to a passivated surface of a substrate; wherein the first adhesive film is adhesively bonded to the second adhesive film, wherein the adhesive bonding laminate comprises the first thermoplastic adhesive film on a first side and the second thermoset adhesive film on a second side;

adhesively bonding the second side of the adhesive bonding laminate to the passivated surface of the substrate;

adhesively bonding the silicon chip to the substrate surface;

adhesively bonding the first side of the adhesive bonding laminate to the epoxy coated side of the flexible circuit.

2. The method of claim 1, wherein the substrate comprises metal.

3. The method of claim 2, wherein the substrate comprises aluminum, zinc, or stainless steel.

4. The method of claim 2, wherein the substrate comprises an alloy.

5. The method of claim 1, wherein the first side of the adhesive bonding laminate comprises thermoplastic polycarbonate or thermoplastic polyether urethane and the second side of the adhesive bonding laminate comprises a phenolic based polymer.

6. The method of claim 5, wherein the first side of the adhesive bonding laminate comprises thermoplastic polycarbonate.

7. The method of claim 1, wherein the first side of the adhesive bonding laminate comprises thermoplastic polyester urethane.

8. The method of claim 1, wherein the substrate has at least one chip cavity.

9. The method of claim 8, further comprising the steps:
aligning the silicon chip with the chip cavity;
applying a tack and hold adhesive and a die-attach adhesive to the silicon chip; and
curing the die-attach adhesive.

10. The method of claim 9, wherein the tack and hold adhesive comprises an ultraviolet cure or a thermal quick cure adhesive.

11. The method of claim 1, wherein the step of adhesively bonding the second side of the adhesive bonding laminate to the passivated surface of the substrate comprises applying heat at a temperature of from about 100° C. to about 180° C. for about 5 to about 30 seconds while the second side of the adhesive bonding laminate is in contact with the passivated surface of the substrate.

12. The method of claim 11, wherein the step of adhesively bonding the second side of the adhesive bonding laminate to the passivated surface comprises applying heat at a temperature of from about 130° C. to about 150° C. for about 10 to about 15 seconds while the second side of the adhesive bonding laminate is in contact with the passivated surface of the substrate.

13. The method of claim 1, wherein the passivated surface comprises a coating of poly para-xylylene on the substrate.

14. The method of claim 1, wherein the step of adhesively bonding the first side of the adhesive bonding laminate to the epoxy coated side of the flexible circuit comprises applying pressure and heat at a temperature of from about 200° C. to about 300° C. for about 5 to about 30 seconds.

15. The method of claim 14, wherein the step of adhesively bonding the first side of the adhesive bonding laminate to the epoxy coated side of the flexible circuit comprises applying pressure and heat at a temperature of about 225° C. to about 275° C. for about 10 to about 15 seconds.

16. The method of claim 9, wherein the step of curing the die-attach adhesive comprises applying heat at a temperature of about 110° C. to about 200° C. for a period of about 15 minutes to about 200 minutes.

17. The method of claim 16, wherein the step of curing the die-attach adhesive comprises applying heat at a temperature of from about 150° C. to about 175° C. for a period of about 30 minutes to about 180 minutes.

18. The method of claim 7, wherein the step of adhesively bonding the first side of the adhesive bonding laminate to the epoxy coated side of the flexible circuit comprises applying pressure and heat at a temperature of from about 150° C. to about 225° C. for about 5 to about 30 seconds.

19. The method of claim 18, wherein the step of adhesively bonding the first side of the adhesive bonding laminate to the epoxy coated side of the flexible circuit comprises applying pressure and heat at a temperature of about 180° C. to about 200° C. for about 10 to about 15 seconds.

20. An ink jet printhead comprising:
a substrate having a passivated surface;
a silicon chip on the passivated surface of the substrate;
a flexible circuit, wherein the flexible circuit has an epoxy coating on one side thereof; and
the adhesive bonding laminate of claim 5 adhesively bonding the flexible circuit to the substrate.

21. The ink jet printhead of claim 20, wherein the adhesive bonding laminate comprises the first adhesive film on a first side and the second adhesive film on a second side, and further wherein the first side is adhesively bonded to the epoxy coating of the flexible circuit and the second side is adhesively bonded to the passivated surface of the substrate.

* * * * *